(12) United States Patent
Li et al.

(10) Patent No.: US 6,949,459 B2
(45) Date of Patent: Sep. 27, 2005

(54) METHOD OF PATTERNING DAMASCENE STRUCTURE IN INTEGRATED CIRCUIT DESIGN

(75) Inventors: Wai-Kin Li, Poughkeepsie, NY (US); Chih-Chao Yang, Beacon, NY (US); Yi-hsiung Lin, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 10/704,022

(22) Filed: Nov. 7, 2003

(65) Prior Publication Data

US 2005/0101128 A1 May 12, 2005

(51) Int. Cl.$^7$ ............... H01L 21/4763; H01L 21/311
(52) U.S. Cl. .................... 438/637; 438/702
(58) Field of Search .............. 438/770, 622–651, 438/589, 571, 514, 396, 256, 255, 702

(56) References Cited

U.S. PATENT DOCUMENTS

| | | | |
|---|---|---|---|
| 6,329,118 B1 | 12/2001 | Hussein et al. | |
| 6,872,666 B2 * | 3/2005 | Morrow | 438/700 |
| 2004/0121588 A1 * | 6/2004 | Choi | 438/637 |

OTHER PUBLICATIONS

"A Novel Approach to Dual Damascene Patterning", Makarem Husseinm Sam Sivakumar, Ruth Brain, Bruce Beattie, Phi Nguyen, Mark Fradkin, International Interconnect Technology Conference, IITC, Jun. 3–5, 2002, 3 Pages.

* cited by examiner

Primary Examiner—Erik Kielin
Assistant Examiner—Monica D. Harrison
(74) Attorney, Agent, or Firm—McGinn & Gibb, PLLC; Todd M.C. Li, Esq.

(57) ABSTRACT

Disclosed is a method that deposits an aqueous material having a pH between approximately 10 and 11 in a first opening and on an oxide hard mask, deposits an organic material on the aqueous material, and patterns a photoresist over the organic material. The invention then etches the organic material and the aqueous material through the photoresist to form a second opening above the first opening and forms a polymer along sidewalls of the second opening. The invention can then perform a wet cleaning process using an alkali solution having a pH between approximately 10 and 11 to remove the aqueous material from the first opening. By utilizing an alkali aqueous (water-based) material having a pH of approximately 10–11, the invention can use a fairly low pH wet etch (pH of approximately 10–11) to completely remove the aqueous solution from the via, thereby eliminating the conventional problem of having residual organic material left within the via.

18 Claims, 4 Drawing Sheets

METHOD OF PATTERNING DAMASCENE STRUCTURE IN INTEGRATED CIRCUIT DESIGN

BACKGROUND OF THE INVENTION

1. Field of the Invention

The present invention generally relates to a method of patterning vias in integrated circuit structures that avoids leaving residual organic material in the vias.

2. Description of the Related Art

Conventional methods for patterning vias often fill the via with a sacrificial organic material such as ARC (anti-reflective coating). However, many such conventional processes encounter the problem of being unable to completely remove the organic material from the via. This is an even more common problem with high aspect ratio vias that have a relatively narrow width compared to their length. The invention described below overcomes such conventional problems by avoiding using organic sacrificial materials within the vias.

SUMMARY OF THE INVENTION

In one embodiment, the invention presents a method of patterning vias in integrated circuit structures. First, the invention forms a cap over a conductor layer, an interlayer dielectric over the cap, and an oxide hard mask over the interlayer dielectric to provide an initial interlayer dielectric structure. The invention then patterns a first opening through the oxide hard mask and the interlayer dielectric to expose the cap.

The invention deposits an aqueous material having a pH between approximately 10 and 11 in the first opening and on the oxide hard mask, deposits an organic material on the aqueous material, and patterns a photoresist over the organic material. The invention then etches the organic material and the aqueous material through the photoresist to form a second opening above the first opening and forms a polymer along sidewalls of the second opening. The invention can then perform a wet cleaning process using an alkali solution having a pH between approximately 10 and 11 to remove the aqueous material from the first opening. Subsequently, the invention etches the oxide hard mask, the interlayer dielectric, and the cap through the second opening, and removes the photoresist, the organic material, and the aqueous material.

The processes of depositing the aqueous material comprises a spin-on process and the aqueous material comprises a water-based, polymide material and is referred to herein as an aqueous removal planerization material (ARPM). More specifically, the aqueous material comprises tetramethyl ammonium hydroxide, or aqueous-alkaline base solution, etc. By utilizing an alkali aqueous (water-based) material having a pH of approximately 10–11, the invention can use a fairly low pH wet etch (pH of approximately 10–11) to completely remove the aqueous solution from the via, thereby eliminating the conventional problem of having residual organic material left within the via.

In another embodiment, the invention forms an oxide layer on the aqueous material and then deposits the organic material on the oxide layer. The invention can then pattern the organic material and the oxide layer through the photoresist to form a second opening, remove the photoresist and the organic material, and etch the oxide hard mask and the interlayer dielectric through the second opening in the oxide layer. Following this, the invention removes the oxide layer, performs a wet cleaning process using an alkali solution having a pH between approximately 10 and 11 to remove the aqueous material from the first opening, and etches the cap through the first opening.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
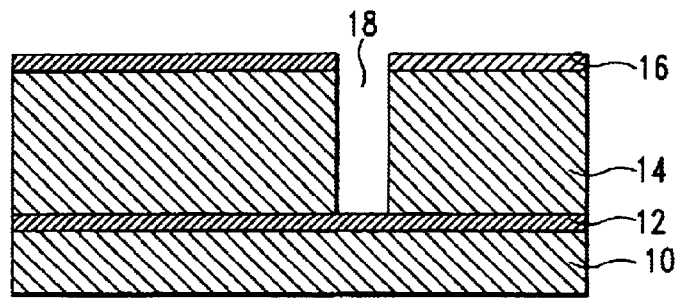
FIG. 1 is a schematic cross-sectional diagram of a partially completed integrated circuit structure according to the first embodiment of the invention.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

A first embodiment of the invention is shown FIGS. 1–7. More specifically, as shown in FIGS. 1–7, the invention presents a method of patterning vias in integrated circuit structures. First, as shown in FIG. 1, the invention forms a cap 12 (e.g., oxide cap) over a conductor layer 10 (e.g., polysilicon layer, metallic layer (e.g., tungsten, copper, aluminum, etc.)), an interlayer dielectric 14 over the cap 12, and an oxide hard mask 16 over the interlayer dielectric 14 to provide an initial interlayer dielectric structure. The invention patterns a first opening 18 through the oxide hard mask 16 and the interlayer dielectric 14 to expose the cap 12.

Figure 2:
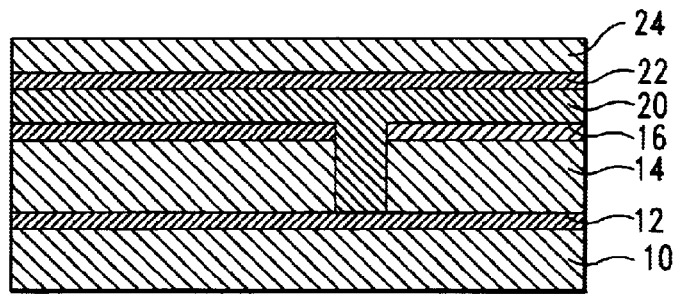
FIG. 2 is a schematic cross-sectional diagram of a partially completed integrated circuit structure according to the first embodiment of the invention.
Figure 3:
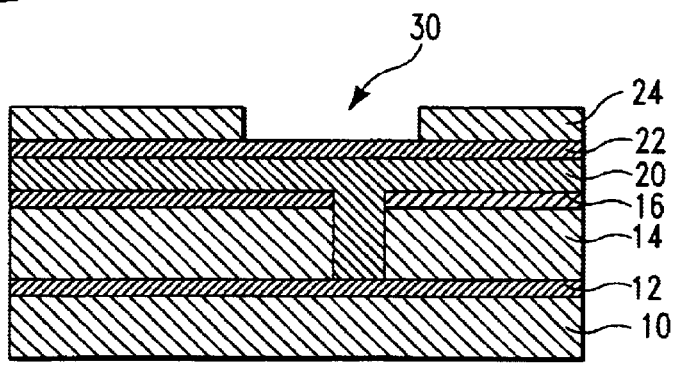
FIG. 3 is a schematic cross-sectional diagram of a partially completed integrated circuit structure according to the first embodiment of the invention.

As shown in FIG. 2, the invention deposits an aqueous material 20 having a pH between approximately 10 and 11 in the first opening 18 and on the oxide hard mask 16. The aqueous material 20 can be deposited in a spin-on process, chemical vapor deposition (CVD) process, etc. The aqueous material 20 comprises a water-based, polymide-based material and is referred to herein as an aqueous removal planerization material (ARPM). More specifically, the aqueous material 20 comprises tetramethyl ammonium hydroxide, also called TMAH, the aqueous-alkaline base developer of choice for the semiconductor industry. Basically, aqueous alkaline solution such as potassium hydroxide (KOH), sodium hydroxide (NAOH), or NH4OH, can be used for this application. Then, the invention deposits an organic material 22 on the aqueous material 20, and patterns a photoresist 24 over the organic material 22. As shown in FIG. 3, the invention then etches the organic material 22 and the aqueous material 20 through the photoresist 24 to form a second opening 30.

Figure 4:
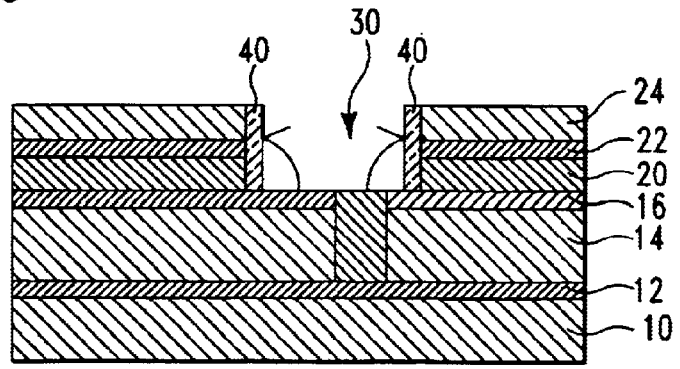
FIG. 4 is a schematic cross-sectional diagram of a partially completed integrated circuit structure according to the first embodiment of the invention.

In FIG. 4, the invention performs additional etching to remove a portion of the aqueous material 20 within the opening 30, thereby exposing a portion of the oxide hard mask 20 that is within the opening 30. This additional etching process leaves the aqueous material 20 within the first opening 18. The invention then forms a polymer 40 along sidewalls of the second opening 30. The formation of the polymer is made possible in a plasma ambient where the flourocarbon radicals get energized and bonded to form a larger group called polymer.

Figure 5:
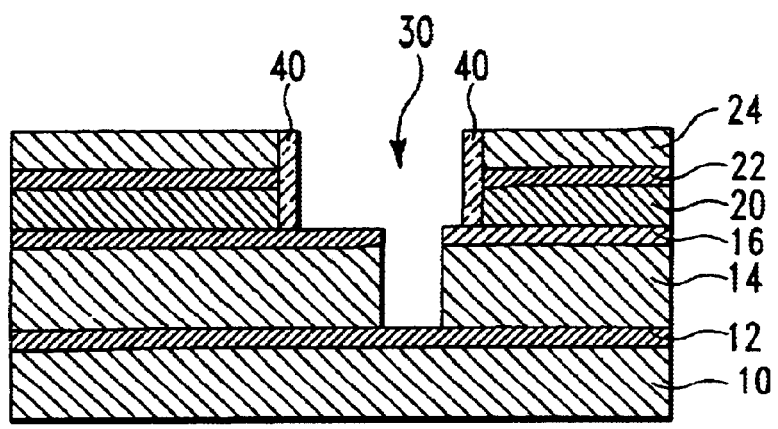
FIG. 5 is a schematic cross-sectional diagram of a partially completed integrated circuit structure according to the first embodiment of the invention.

As shown in FIG. 5, the invention then performs a water-based wet cleaning process using an alkali solution having a pH between approximately 10 and 11 to remove the aqueous material 20 from the first opening 18. Since ARPM material can be dissolved by (TMAH) or aqueous alkaline base solution, the invention can use the puddle or spray method to remove ARPM material. The advantage of this process that there is no polymer residual after RIE processing.

Thus, by utilizing an alkali aqueous (water-based) material having a pH of approximately 10–11, the invention can use a fairly weak (low pH) wet etch (pH of approximately 10–11) to completely remove the aqueous solution from the via, thereby eliminating the conventional problem of having residual organic material 22 left within the via.

Figure 6:
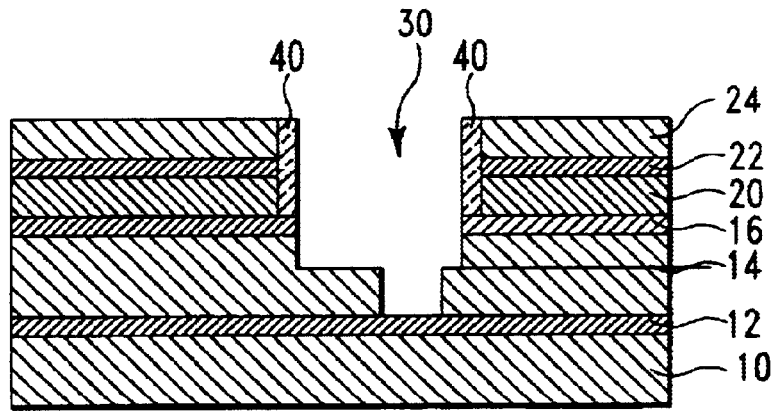
FIG. 6 is a schematic cross-sectional diagram of a partially completed integrated circuit structure according to the first embodiment of the invention.
Figure 7:
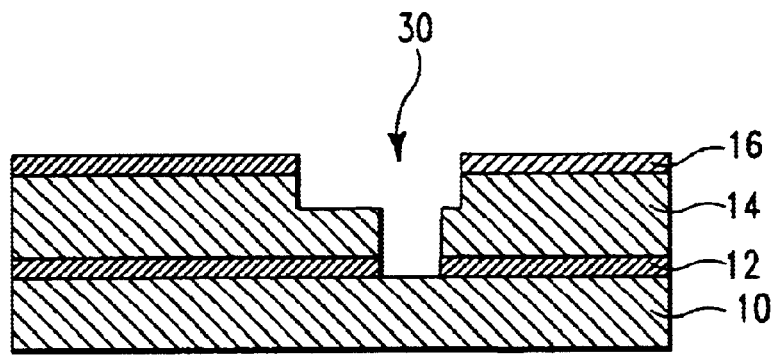
FIG. 7 is a schematic cross-sectional diagram of a partially completed integrated circuit structure according to the first embodiment of the invention.

As shown in FIG. 6, the invention etches the oxide hard mask 16, the interlayer dielectric 14, and the cap 12 through the second opening 30. In FIG. 7, the invention removes the photoresist 24, the organic material 22, and the aqueous material 20 to provide a structure that is ready for damascene (or dual damascene) processing that will create a conductive via through the opening 18 to the conductor 10.

Figure 8:
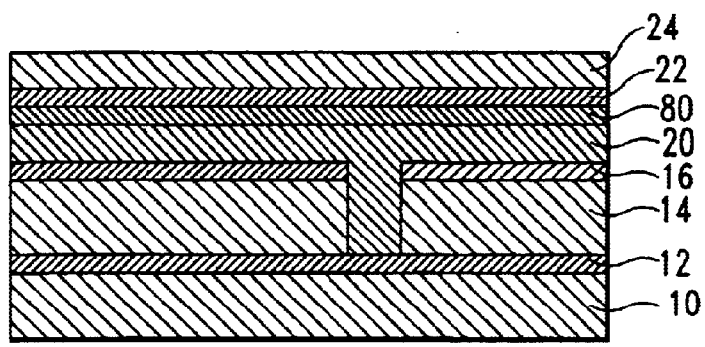
FIG. 8 is a schematic cross-sectional diagram of a partially completed integrated circuit structure according to the second embodiment of the invention.
Figure 9:
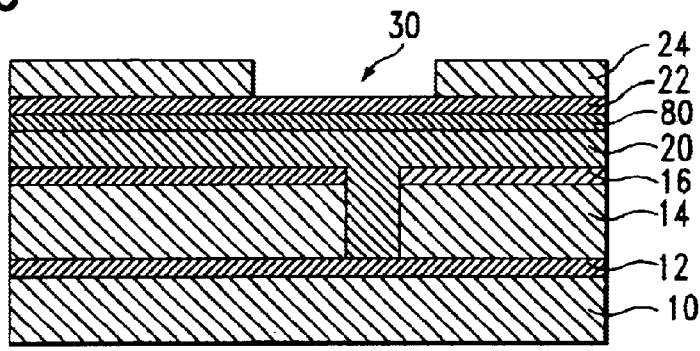
FIG. 9 is a schematic cross-sectional diagram of a partially completed integrated circuit structure according to the second embodiment of the invention.
Figure 10:
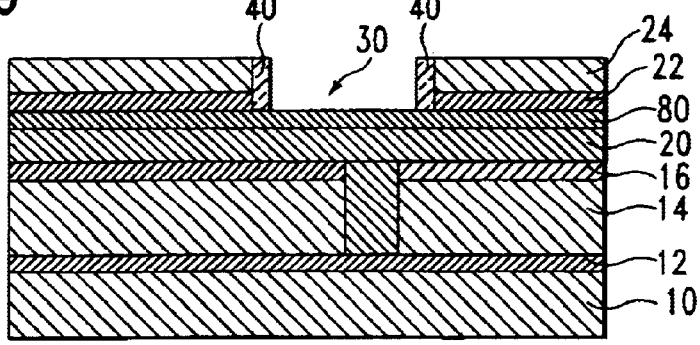
FIG. 10 is a schematic cross-sectional diagram of a partially completed integrated circuit structure according to the second embodiment of the invention.
Figure 11:
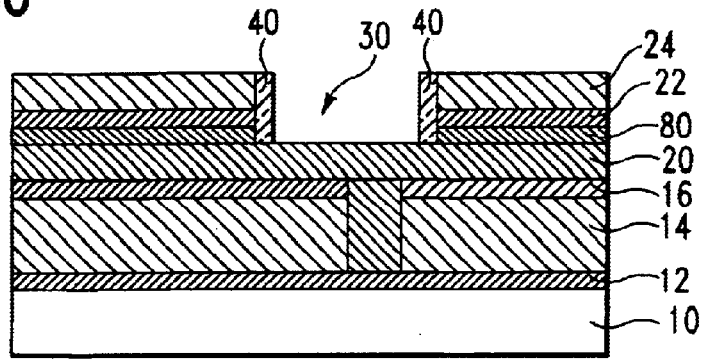
FIG. 11 is a schematic cross-sectional diagram of a partially completed integrated circuit structure according to the second embodiment of the invention.
Figure 12:
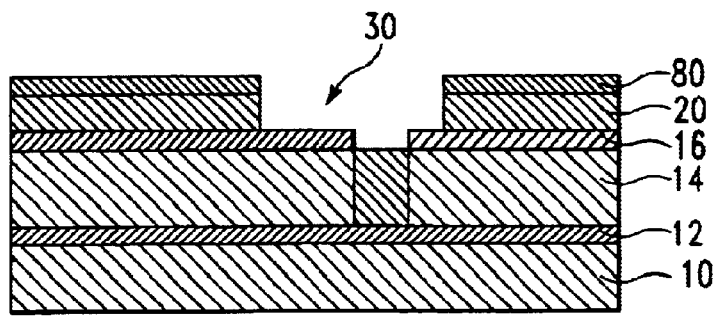
FIG. 12 is a schematic cross-sectional diagram of a partially completed integrated circuit structure according to the second embodiment of the invention.
Figure 13:
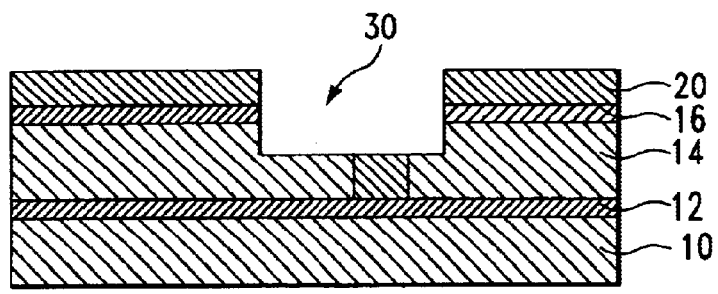
FIG. 13 is a schematic cross-sectional diagram of a partially completed integrated circuit structure according to the second embodiment of the invention.
Figure 14:
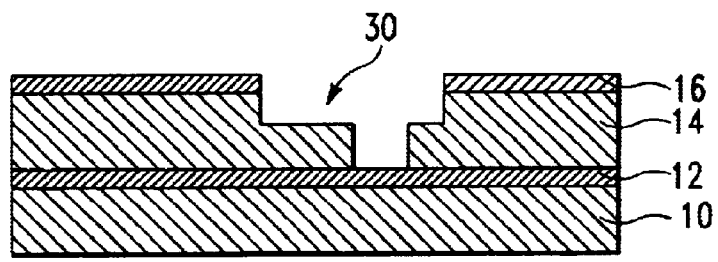
FIG. 14 is a schematic cross-sectional diagram of a partially completed integrated circuit structure according to the second embodiment of the invention.
Figure 15:
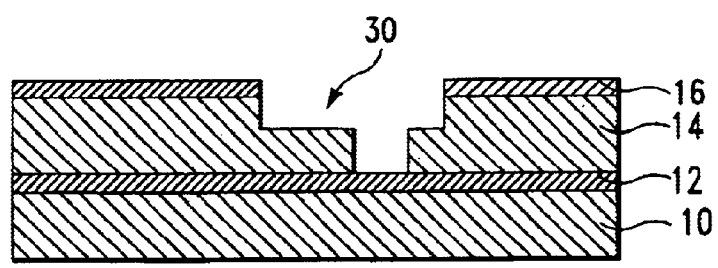
FIG. 15 is a schematic cross-sectional diagram of a partially completed integrated circuit structure according to the second embodiment of the invention.

In another embodiment shown in FIGS. 8–15, the invention avoids the need to form the polymide 40, discussed above. This embodiment also begins with the structure shown in FIG. 1, discussed above. Then, as shown in FIG. 8, the invention forms an oxide layer 80 on the aqueous material 20. Next, as shown in FIG. 9, the invention then deposits the organic material 22 on the oxide layer 80 (instead of on the aqueous material 20 as in the first embodiment). The invention then patterns the photoresist (FIG. 9). The invention etches the organic material 22 (FIG. 10) and the oxide layer 80 (FIG. 11) through the photoresist 24 to form the second opening 30. In FIG. 12, the invention removes the photoresist 24 and the organic material, and (in FIG. 13) etches the oxide hard mask 16 and the interlayer dielectric 14 through the second opening 30 in the oxide layer 80. Following this, the invention removes the oxide layer 80 and, performs a wet cleans process using an alkali solution having a pH between approximately 10 and 11 to remove the aqueous material 20 from the first opening 18, as shown in FIG. 14. Next, the invention etches the cap 12 through the first opening 18 to expose the conductor 10.

As mentioned above, by utilizing an alkali aqueous (water-based) material having a pH of approximately 10–11, the invention can use a fairly weak (low pH) wet etch (pH of approximately 10–11) to completely remove the aqueous solution from the via, thereby eliminating the conventional problem of having residual organic material 22 left within the via. Besides the effectiveness of removing residual organic material in the via bottom, this invention also prevents free sidewall damage, which may be induced by the conventional approach of stripping out photoresist using the dry etch method.

While the invention has been described in terms of preferred embodiments, those skilled in the art will recognize that the invention can be practiced with modification within the spirit and scope of the appended claims.

What is claimed is:

1. A method of patterning a via in an integrated circuit structure, said method comprising:

patterning a first opening through an interlayer dielectric structure;

depositing an aqueous material in said first opening and on said interlayer dielectric structure;

depositing an organic material on said aqueous material;

patterning said organic material and said aqueous material to form a second opening above said first opening;

forming a polymer along sidewalls of said second opening; and performing a wet cleaning process using an alkali solution having a pH between approximately 10 and 11 to remove said aqueous material from said first opening.

2. The method in claim 1, wherein said process of depositing said aqueous material comprises a spin-on process.

3. The method in claim 1, wherein said aqueous material comprises a water-based, polymide-based material.

4. The method in claim 1, wherein said aqueous material comprises one of tetramethyl ammonium hydroxide, and aqueous alkaline base solution.

5. The method in claim 1, further comprising:

etching said interlayer dielectric structure through said second opening; and removing said photoresist, said organic material, and said aqueous material.

6. The method in claim 1, wherein said patterning of said organic material and said aqueous material comprises:

patterning a photoresist over said organic material; and etching said organic material and said aqueous material through said photoresist to form said second opening.

7. The method in claim 1, wherein said interlayer dielectric structure is formed in a process comprising:

forming a cap over a conductor layer;

forming an interlayer dielectric over said cap; and forming an oxide hard mask over said interlayer dielectric.

8. A method of patterning a via in an integrated circuit structure, said method comprising:

patterning a first opening through an interlayer dielectric structure;

depositing an aqueous material in said first opening and on said interlayer dielectric structure;

forming an oxide layer on said aqueous material;

depositing an organic material on said oxide layer;

patterning said organic material and said oxide layer to form a second opening above said first opening;

removing said organic material;

etching said interlayer dielectric structure through said second opening in said oxide layer;

removing said oxide layer; and performing a wet cleaning process using an alkali solution having a pH between approximately 10 and 11 to remove said aqueous material from said first opening.

9. The method in claim 8, wherein said process of depositing said aqueous material comprises a spin-on process.

10. The method in claim 8, wherein said aqueous material comprises a water-based, polymide-based material.

11. The method in claim 8, wherein said aqueous material comprises one of tetramethyl ammonium hydroxide, and aqueous alkaline base solution.

12. The method in claim 8, further comprising opening a cap within said interlayer dielectric structure.

13. The method in claim 8, wherein said patterning of said organic material and said oxide layer comprises:

patterning a photoresist over said organic material; and etching said organic material and said oxide layer through said photoresist to form said second opening.

14. The method in claim 8, wherein said interlayer dielectric structure is formed in a process comprising:

forming a cap over a conductor layer;

forming an interlayer dielectric over said cap; and forming an oxide hard mask over said interlayer dielectric.

15. A method of patterning vias in integrated circuit structures, said method comprising:

forming a cap over a conductor layer;

forming an interlayer dielectric over said cap;

forming an oxide hard mask over said interlayer dielectric;

patterning a first opening through said oxide hard mask and said interlayer dielectric to expose said cap;

depositing an aqueous material having a pH between approximately 10 and 11 in said first opening and on said oxide hard mask;

depositing an organic material on said aqueous material;

patterning a photoresist over said organic material;

etching said organic material and said aqueous material through said photoresist to form a second opening above said first opening;

forming a polymer along sidewalls of said second opening;

performing a wet cleaning process using an alkali solution having a pH between approximately 10 and 11 to remove said aqueous material from said first opening;

etching said oxide hard mask, said interlayer dielectric, and said cap through said second opening; and removing said photoresist, said organic material, and said aqueous material.

16. The method in claim 15, wherein said process of depositing said aqueous material comprises a spin-on process.

17. The method in claim 15, wherein said aqueous material comprises a water-based, polymide-based material.

18. The method in claim 15, wherein said aqueous material comprises one of tetramethyl ammonium hydroxide, and aqueous alkaline base solution.

* * * * *